United States Patent
Yoon et al.

(10) Patent No.: US 7,747,231 B2
(45) Date of Patent: Jun. 29, 2010

(54) SYSTEM AND METHOD FOR TRANSMITTING SIGNAL IN A COMMUNICATION SYSTEM

(75) Inventors: Hyun-Su Yoon, Yongin-si (KR); Joong-Ho Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 691 days.

(21) Appl. No.: 11/478,236

(22) Filed: Jun. 29, 2006

(65) Prior Publication Data

US 2007/0004350 A1     Jan. 4, 2007

(30) Foreign Application Priority Data

Jun. 29, 2005     (KR)     ........................ 10-2005-0056985

(51) Int. Cl.
H04B 1/04     (2006.01)

(52) U.S. Cl. ................. 455/127.3; 455/127.1; 455/144; 455/194.2

(58) Field of Classification Search ............. 455/127.3, 455/127.1, 91, 114.3, 552.1, 293, 1, 144, 455/194.2, 127.2, 311, 341, 143, 168.1, 176.1, 455/227; 330/51, 128–129, 302, 151, 252; 370/321, 337
See application file for complete search history.

(56) References Cited

U.S. PATENT DOCUMENTS

| | | | |
|---|---|---|---|
| 5,541,554 A * | 7/1996 | Stengel et al. | 330/51 |
| 6,489,843 B1 * | 12/2002 | Nishijima et al. | 330/51 |
| 7,006,805 B1 | 2/2006 | Sorrells et al. | |
| 7,313,416 B1 * | 12/2007 | Harmon et al. | 455/562.1 |
| 2006/0084469 A1 * | 4/2006 | Malone et al. | 455/552.1 |
| 2007/0032208 A1 * | 2/2007 | Choi et al. | 455/114.3 |
| 2008/0030276 A1 * | 2/2008 | Hau et al. | 330/279 |
| 2008/0057883 A1 * | 3/2008 | Pan | 455/127.1 |

FOREIGN PATENT DOCUMENTS

| | | |
|---|---|---|
| JP | 02-52512 | 2/1990 |
| JP | 03-250805 | 11/1991 |
| JP | 04-54006 | 2/1992 |
| JP | 07-123014 | 5/1995 |
| JP | 09-116359 | 5/1997 |
| JP | 09-135124 | 5/1997 |
| JP | 10-41857 | 2/1998 |
| JP | 2000-49627 | 2/2000 |
| JP | 2000-509229 | 7/2000 |
| JP | 2000-353927 | 12/2000 |
| JP | 2001-527312 | 12/2001 |
| JP | 2003-507956 | 2/2003 |
| JP | 2005-123762 | 5/2005 |
| KR | 1020020012105 | 2/2002 |
| KR | 102002007836 | 10/2002 |
| WO | WO 97/41642 | 11/1997 |
| WO | WO 99/33170 | 7/1999 |

* cited by examiner

*Primary Examiner*—Pablo N Tran
(74) *Attorney, Agent, or Firm*—The Farrell Law Firm, LLP

(57) ABSTRACT

A system and method for transmitting a signal in a communication system are provided. In the signal transmitting method, a multi-FA signal is generated by combining single FA signals to be transmitted by N FAs. An operation mode is determined for N MMPAs according to a used FA strategy and adjustment of amplification characteristics of the N MMPAs is controlled according to the operation mode. The power of the multi-FA signal is divided by N, the N divided signals are amplified according to the adjusted amplification characteristics, and the power of the amplified N signals is combined.

13 Claims, 7 Drawing Sheets

SYSTEM AND METHOD FOR TRANSMITTING SIGNAL IN A COMMUNICATION SYSTEM

PRIORITY

This application claims priority under 35 U.S.C. §119 to an application filed in the Korean Intellectual Property Office on Jun. 29, 2005 and assigned Serial No. 2005-56985, the contents of which are incorporated herein by reference.

BACKGROUND OF THE INVENTION

1. Field of the Invention

The present invention relates generally to a signal transmitting system and method in a mobile communication system, and in particular, to a system and method for transmitting a signal using a Multi-Mode Power Amplifier (MMPA) in a communication system.

2. Description of the Related Art

Provisioning of services having a variety of Quality of Service (QoS) levels at a high rate is an active study area for future-generation communication systems. Particularly, studies are actively being conducted on provisioning of high-speed services with mobility and QoS guaranteed in Broadband Wireless Access (BWA) systems including Wireless Local Area Network (WLAN) and Metropolitan Area Network (MAN), for future-generation communications. In this context, the 4$^{th}$ Generation (4G) mobile communication system is being developed toward the use of multiple carriers for high-speed service while guaranteeing mobility and QoS.

Regarding a signal transmitting system in a typical communication system, there are two types of signal transmitting systems: one uses a Single Carrier Power Amplifier (SCPA) and the other uses a Multi-Carrier Power Amplifier (MCPA). Both kinds of signal transmitting systems may use a single Frequency Assignment (FA) or multiple FAs. With reference to FIG. 1, the structure of an SCPA-type signal transmitting system using a single FA will be described.

FIG. 1 is a block diagram of an SCPA-using signal transmitting system operating under a single FA in a typical communication system. Referring to FIG. 1, the signal transmitting system includes a Single-FA input Signal Generation Block (SGB) 111, an SCPA 113, a Front-End Block (FEB) 115, and an antenna (ANT) 117.

For the input of an information signal to be transmitted, the SGB 111 generates a single FA input signal corresponding to a single FA, f1. The SCPA 113 amplifies the single FA signal f1 by a predetermined gain. The FEB 115 performs Radio Frequency (RF) preprocessing on the amplified signal and sends the RF preprocessed signal through the ANT 117.

The signal transmitting system, which operates using a single FA as illustrated in FIG. 1, may also use multiple FAs, which will be described below.

FIG. 2 is a block diagram of an SCPA-type signal transmitting system operating under multiple FAs in the typical communication system.

It is assumed herein that the signal transmitting system uses N FAs, f1 to fN. Referring to FIG. 2, the signal transmitting system includes N SGBs 211-1 to 211-N, N SCPAs 213-1 to 213-N, a Channel Combiner Block (CCB) 215, an FEB 217, and an ANT 219.

Information signals to be transmitted by the respective FAs are provided to corresponding SGBs. Specifically, an information signal for f1 is provided to the SGB 211-1 and in the same manner, an information signal for fN is provided to the SGB 211-N.

For the input of the information signal, the SGB 211-1 generates a single FA input signal corresponding to f1. In the same manner, the SGB 211-N generates a single FA input signal corresponding to fN, for the input of the corresponding information signal. The SCPA 213-1 amplifies the single FA signal received form the SGB 211-1 by a predetermined gain and in the same manner, the SCPA 213-N amplifies the single FA signal received form the SGB 211-N by a predetermined gain.

The CCB 215 channel-combines the amplified signals received from the SCPAs 213-1 to 213-N. The FEB 217 RF-preprocesses the combined signal and sends the preprocessed signal through the ANT 219.

Because the CCB 215 suffers a significant insertion loss, channel-combining of adjacent FAs is very difficult. Therefore, in case where multi-FAs are used, the SCPAs 213-1 to 213-N are designed to have a higher gain due to the insertion loss, for ensuring the same transmit power as that of a signal transmitted from the ANT in the SCPA-using signal transmitting system operating with a single FA. That is, the gain of the SCPAs 213-1 to 213-N must be increased due to the insertion loss, compared to the use of an MCPA.

Consequently, when the SCPA-type signal transmitting system uses more FAs, it is equipped with as many SCPAs as the number of the FAs. Considering the antenna transmit power, more power is consumed due to the insertion loss of the CCB 215, compared to the case of using an MCPA. The resulting requirement of cooling capacity in the signal transmitting system increases the overall system operation cost.

With reference to FIG. 3, a description will be made of the structure of an MCPA-type signal transmitting system operating with a single FA. FIG. 3 is a block diagram of an MCPA-type signal transmitting system operating under a single FA in the typical communication system. Referring to FIG. 3, the signal transmitting system includes an SGB 311, an MCPA 313, an FEB 315, and an ANT 317.

For the input of an information signal to be transmitted, the SGB 311 generates a single FA input signal corresponding to a single FA, f1. The MCPA 313 amplifies the single FA signal f1 by a predetermined gain. The FEB 315 performs RF preprocessing on the amplified signal and sends the RF preprocessed signal through the ANT 317.

While it can amplify in the single FA case as illustrated in FIG. 3, the MCPA 313 is optimized for multi-FA amplification. Therefore, the operation of the MCPA 313 with the single FA leads to unnecessary power consumption. In addition, since the MCPA 313 is expensive relative to an SCPA, the initial installation cost of the whole system is increased.

FIG. 4 is a block diagram of an MCPA-type signal transmitting system operating under multiple FAs in the typical communication system.

It is assumed herein that the signal transmitting system uses N FAs, f1 to fN. Referring to FIG. 4, the signal transmitting system includes N SGBs 411-1 to 411-N, an FA Combiner Block (FCB) 413, an MCPA 415, an FEB 417, and an ANT 419.

Information signals to be transmitted by the respective FAs are provided to corresponding SGBs. Specifically, an information signal for f1 is provided to the SGB 411-1 and in the same manner, an information signal for fN is provided to the SGB 411-N.

For the input of the information signal, the SGB 411-1 generates a single FA input signal corresponding to f1. In the same manner, the SB 411-N generates a single FA input signal corresponding to fN, for the input of the corresponding information signal. The FCB 413 FA-combines the N single FA signals received from the SGBs 411-1 to 411-N, thereby creating a multi-FA signal.

The MCPA 415 amplifies the multi-FA signal received from the FCB 413 by a predetermined gain. The FEB 417 RF-preprocesses the amplified signal and sends the preprocessed signal through the ANT 419.

Compared to the use of the SCPA, the use of the MCPA obviates the need for a CCB even in the case of using multiple FAs. Therefore, a power consumption increase caused by the insertion loss of the CCB is avoided. However, the manufacturing cost of the MCPA is typically higher than that of the SCPA. In addition, when a small number of FAs are used, the capacity of the MCPA is only partially utilized, thereby unnecessarily increasing the initial installation cost of the system. If an SCPA operates under too a small number of FAs to need a CCB, the signal transmitting system using the MCPA is less efficient than that using the SCPA in terms of structural complexity.

SUMMARY OF THE INVENTION

An object of the present invention is to substantially solve at least the above problems and/or disadvantages and to provide at least the advantages below. Accordingly, the present invention provides a system and method for transmitting a signal using a multi-mode power amplifier (MMPA) in a communication system.

According to one aspect of the present invention, in a signal transmitting system in a communication system, an SGB creates a single FA signal using an information signal in correspondence with a predetermined FA. An MMPA adjusts its amplification characteristics under a predetermined control and amplifies the single FA signal according to the adjusted amplification characteristics. An MMPA mode controller (MMC) determines an operation mode for the MMPA according to a used FA strategy and controls the MMPA to adjust the amplification characteristics in correspondence with the determined operation mode.

According to another aspect of the present invention, in a signal transmitting system in a communication system, a Multi-FA input signal Generation Block (MGB) creates a multi-FA signal by combining single FA signals to be transmitted by N FAs under a predetermined control. A Multi-FA Power amplifier Block (MPB) divides the power of the multi-FA signal by N under a predetermined control, amplifies the N divided signals according to adjusted amplification characteristics under a predetermined control, and combines the power of the amplified N signals. An MMC controls adjustment of the amplification characteristics according to a used FA strategy.

According to a further aspect of the present invention, in a signal transmitting method in a communication system, a single FA signal is generated using an information signal in correspondence with a predetermined FA. An operation mode is determined for an MMPA according to a used FA strategy and controlling amplification characteristics of the MMPA according to the determined operation mode. The single FA signal is amplified according to the adjusted amplification characteristics.

According to still another aspect of the present invention, in a signal transmitting method in a communication system, a multi-FA signal is generated by combining single FA signals to be transmitted by N FAs. An operation mode is determined for N MMPAs according to a used FA strategy and adjustment of amplification characteristics of the N MMPAs is controlled according to the operation mode. The power of the multi-FA signal is divided by N, the N divided signals are amplified according to the adjusted amplification characteristics, and the power of the amplified N signals is combined.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention provides a system and method for transmitting a signal using a Multi-Mode Power Amplifier (MMPA) in a communication system. Particularly, the present invention provides a signal transmitting system and method for minimizing initial installation cost and operation cost regardless of the number of used Frequency Assignments (FAs), i.e., regardless of whether a single FA or multiple FAs are used.

Figure 1:
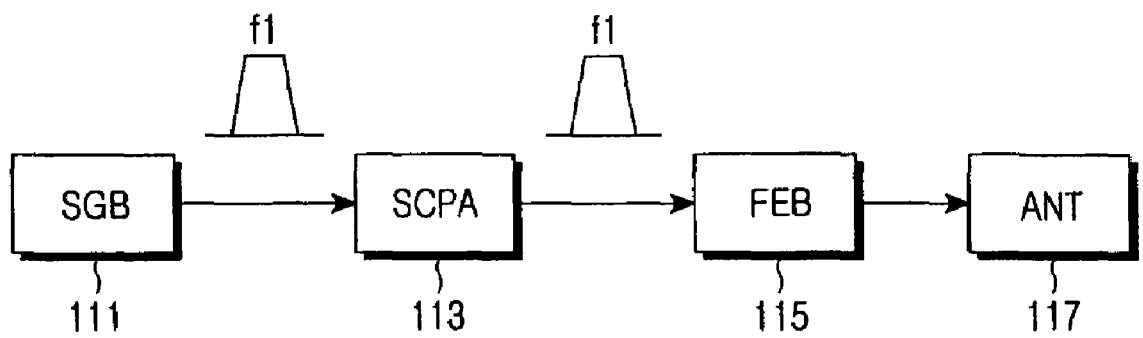
FIG. 1 is a block diagram of an SCPA-type signal transmitting system operating under a single FA in a typical communication system.
Figure 2:
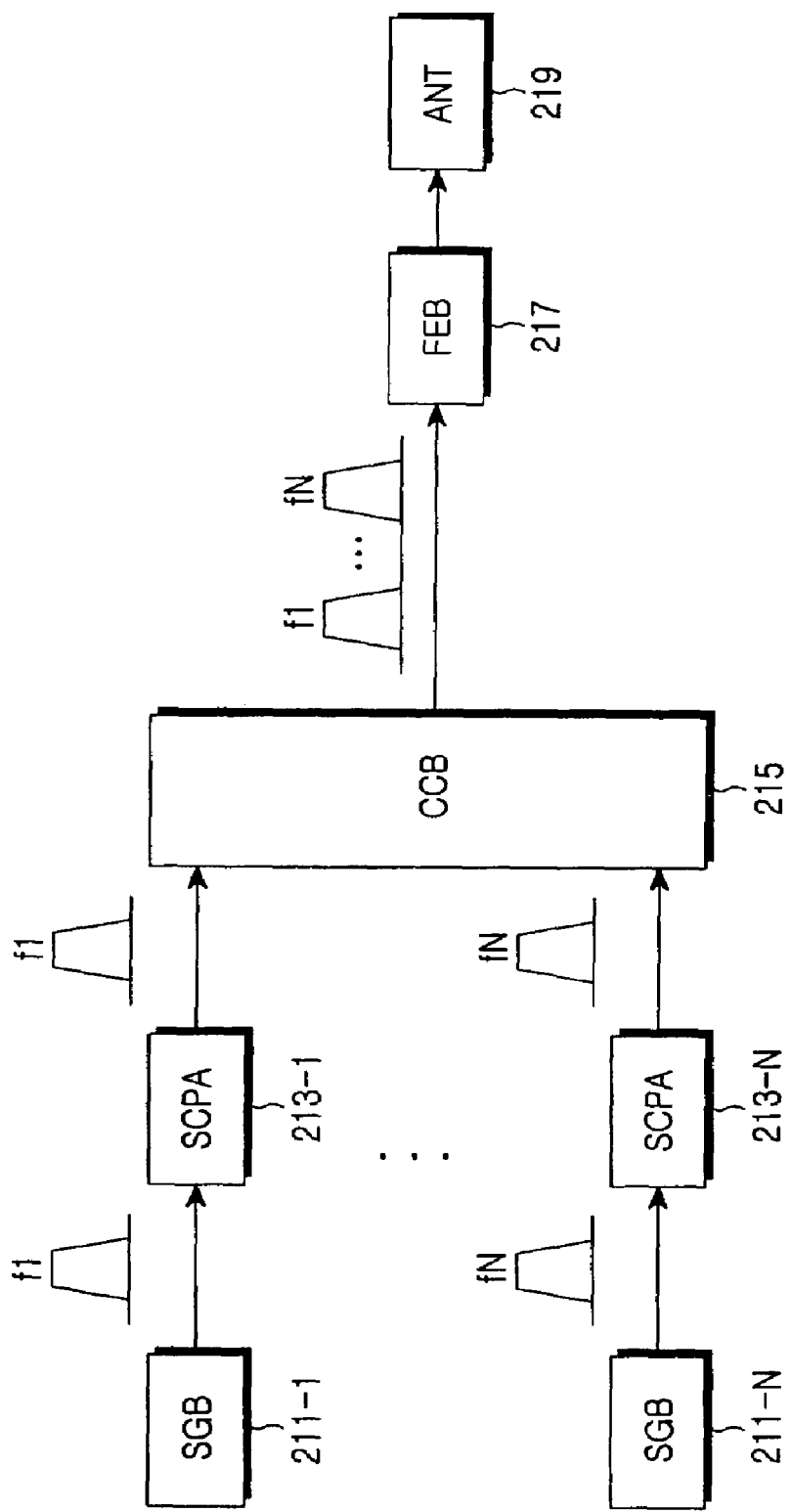
FIG. 2 is a block diagram of an SCPA-type signal transmitting system operating under multiple FAs in the typical communication system.
Figure 3:
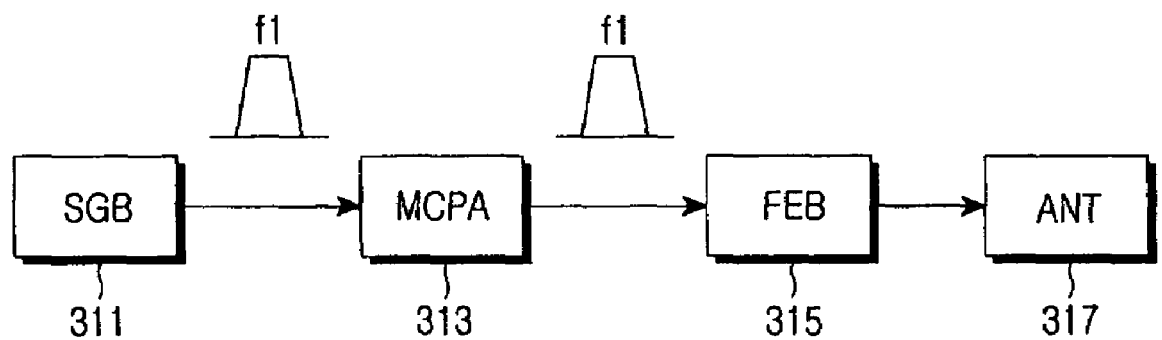
FIG. 3 is a block diagram of an MCPA-type signal transmitting system operating under a single FA in the typical communication system.
Figure 4:
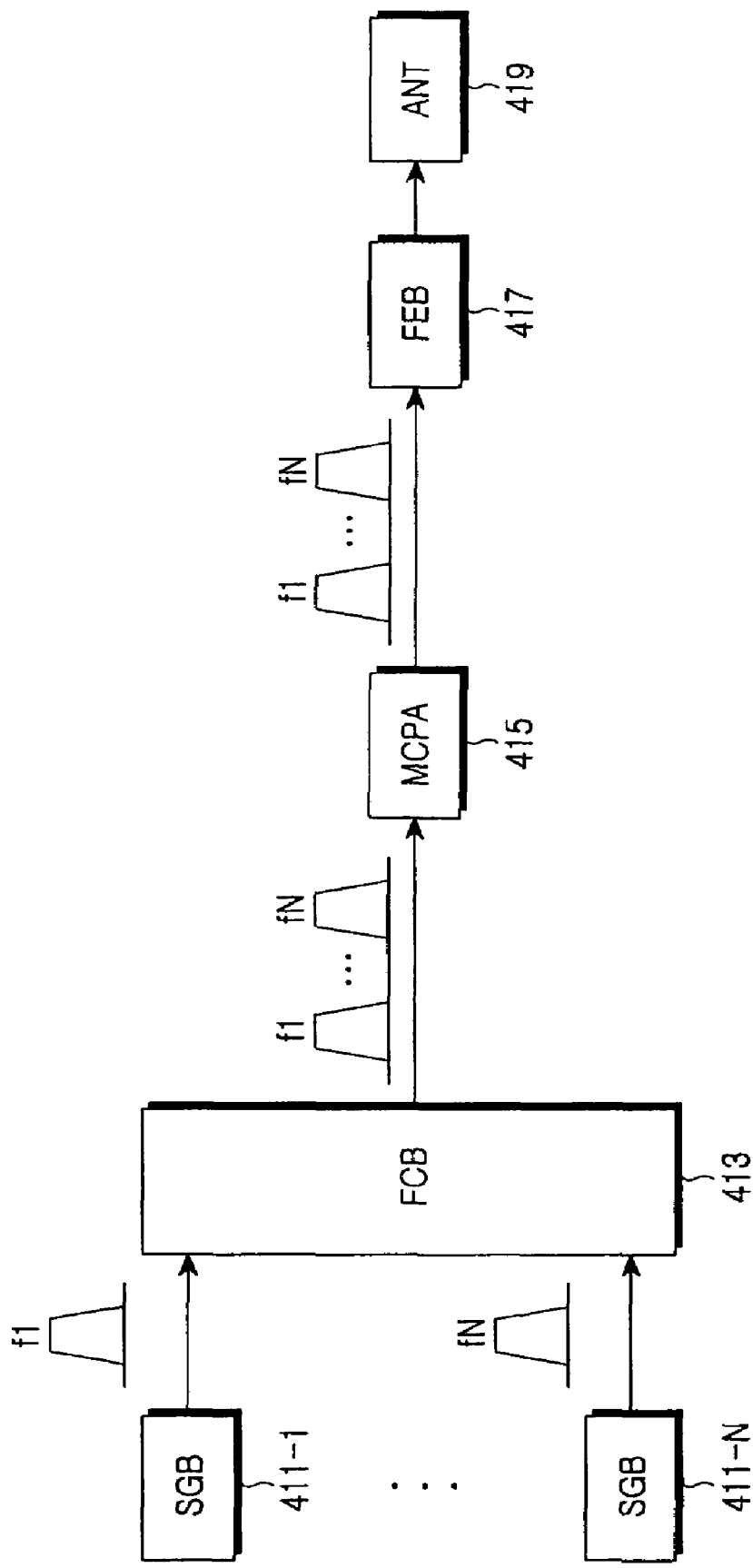
FIG. 4 is a block diagram of an MCPA-type signal transmitting system operating under multiple FAs in the typical communication system.
Figure 5:
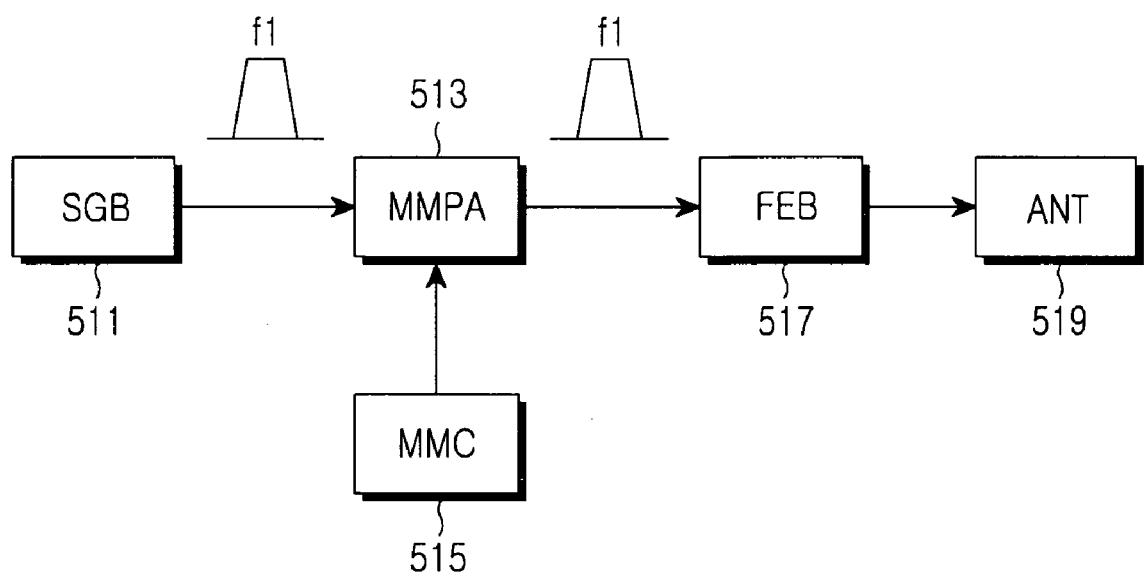
FIG. 5 is a block diagram of an MMPA-type signal transmitting system operating under a single FA in a mobile communication system according to the present invention.

FIG. 5 is a block diagram of an MMPA-type signal transmitting system operating under a single FA in a mobile communication system according to the present invention.

Referring to FIG. 5, the signal transmitting system includes a Signal Generation Block (SGB) 511, an MMPA 513, an MMPA mode Controller (MMC) 515, a Front-End Block (FEB) 517, and an antenna (ANT) 519.

For the input of an information signal to be transmitted, the SGB 511 generates a single FA input signal corresponding to a single FA, f1. The MMPA 513 amplifies the single FA signal f1 by a predetermined gain. The MMPA 513 changes its operation mode under the control of the MMC 515.

The MMC 515 determines whether the signal transmitting system operates under a single FA or multiple FAs. Since the signal transmitting system illustrates in FIG. 5 uses a single FA, the MMC 515 determines the operation mode of the MMPA 513 to be single FA mode.

In general, the single FA signal assumes narrow-band characteristics relative to a multi-FA signal. Therefore, an optimal amplification method varies for a Power Amplifier (PA) for amplifying the narrow-band single FA signal depending on whether the PA uses a linearizer and what type of linearizer it uses. In each case, there always exists an optimal amplification method for the single FA signal in terms of spurious radiation and efficiency.

The multi-FA signal assumes broad-band characteristics relative to the single FA signal. Therefore, an optimal amplification method varies for a PA for amplifying the broad-band multi-FA signal depending on whether the PA uses a linearizer and what type of linearizer it uses. In each case, there always exists an optimal amplification method for the multi-FA signal in terms of spurious radiation and efficiency.

That is, a PA used in a signal transmitting system adopts different optimal amplification methods for a single FA signal being a narrow-band signal and a multi-FA signal being a broad-band signal. Depending on the use of the single FA signal or the multi-FA signal, a single PA. (i.e., an MMPA) is optimized correspondingly. Consequently, initial installation cost and operation code are minimized.

Since the MMPA 513 determines the operation mode of the MMC 515 to be the single FA mode, it adjusts its amplification characteristics in an optimal way for amplification of the single FA signal and correspondingly amplifies the single FA signal. The FEB 517 performs RF preprocessing on the amplified signal and sends the RF preprocessed signal through the ANT 519.

Figure 6:
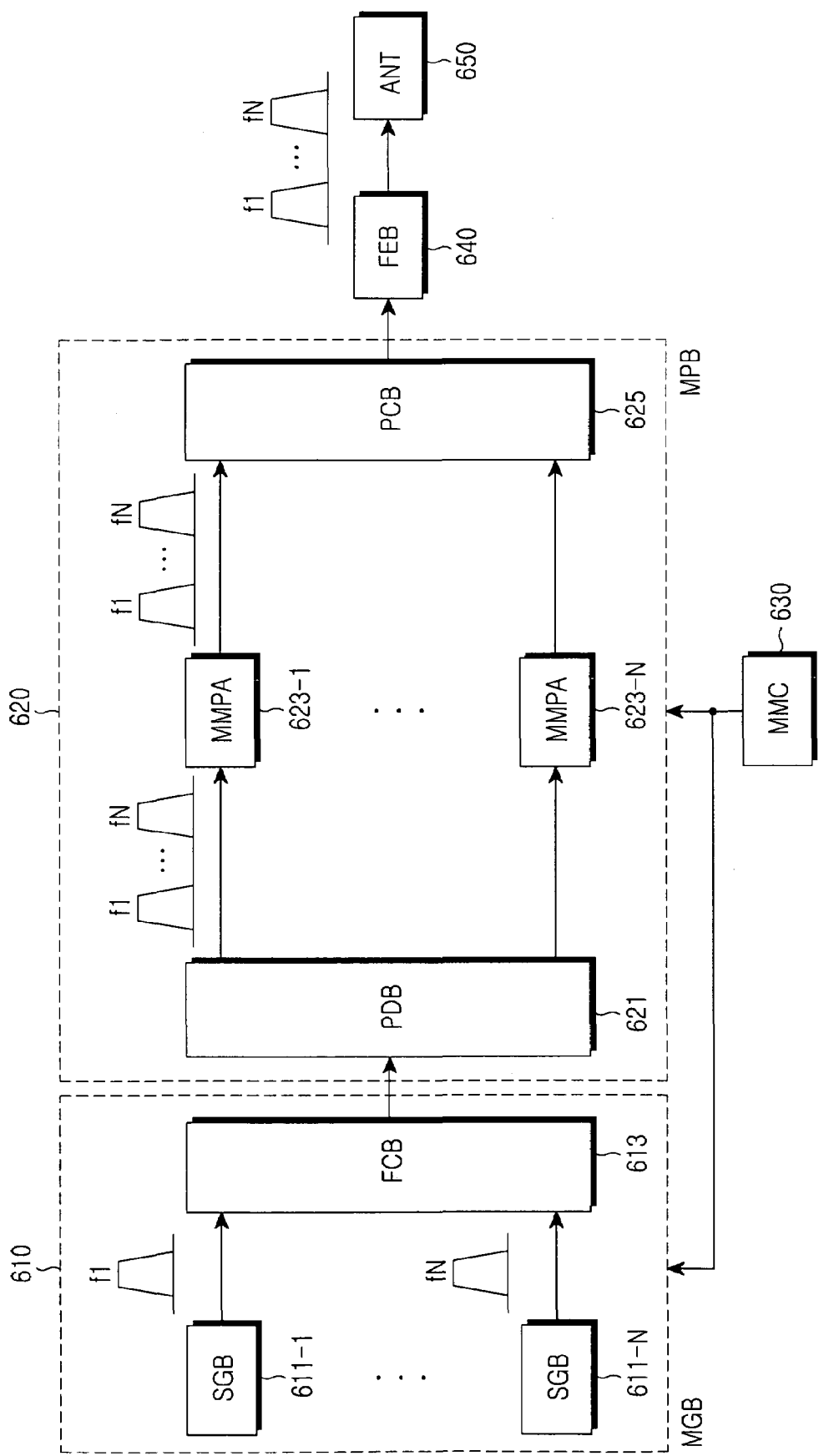
FIG. 6 is a block diagram of an MMPA-type signal transmitting system operating under multiple FAs in the mobile communication system according to the present invention.

FIG. 6 is a block diagram of an MMPA-type signal transmitting system operating under multiple FAs in the mobile communication system according to the present invention.

It is assumed herein that the signal transmitting system uses N FAs, f1 to fN. Referring to FIG. 6, the signal transmitting system includes a Multi-FA input signal Generation Block (MGB) 610, a Multi-FA Power amplifier Block (MPB) 620, an MMC 630, an FEB 640, and an ANT 650. The MGB 610 includes N SGBs 611-1 to 611-N and an FA Combiner Block (FCB) 613. The MPB 620 is comprised of a Power Divider Block (PDB) 621, N MMPAs 623-1 to 623-N, and a Power Combiner Block (PCB) 625.

Information signals to be transmitted by the respective FAs are provided to corresponding SGBs in the MGB 610. Specifically, an information signal for f1 is provided to the SGB 611-1 and in the same manner, an information signal for fN is provided to the SGB 611-N.

For the input of the information signal, the SGB 611-1 generates a single FA input signal corresponding to f1. In the same manner, the SGB 611-N generates a single FA input signal corresponding to fN, for the input of the corresponding information signal. The FCB 613 FA-combines the N single FA signals received from the SGBs 611-1 to 611-N, thus creating a multi-FA signal. Due to the combining of relatively low-power single FA signals, the FCB 613 has little effect on the amplification characteristics of the MMPA, compared to the signal transmitting system using a CCB.

The PDB 621 equally distributes the power of the multi-FA signal received from the FCB 613 to N paths and provides the resulting signals to the MMPAs 623-1 to 623-N. The equally power-distributed signals are of the same frequency characteristic. The MMPAs 623-1 to 623-N amplify the received signals by a predetermined gain.

The MMPAs 623-1 to 623-N change their operation mode under the control of the MMC 630. Since the MMC 630 decides the multi-FA mode for the MMPAs, they adjust their amplification characteristics optimally for the multi-FA signal and correspondingly amplify the multi-FA signal by the predetermined gain.

The PCB 625 combines the powers of the amplified signals received from the MMPAs 623-1 to 623-N. The power combining step differs drastically from the channel combining step of the CCB. Since the CCB combines a plurality of FA signals with different frequencies, the FA signals each require a higher isolation from the other FA signals, thereby increasing insertion loss. As a result, multiple FAs are adopted. However, when an SCPA is used under the multiple FAs, the output of the SCPA must be increased by as much as the CCB insertion loss in order to maintain the same antenna transmit power for each FA signal. As a consequence, power consumption increases and the SCPA must be designed to have as large a capacity as the CCB insertion loss. In addition, it is very difficult to ensure a certain level of isolation for neighbor FAs, thereby making it difficult to channel-combine the neighbor FA signals.

On the contrary, because the PCB 625 combines the same frequency signals amplified by the same amplitude and the same phase in the MMPAs 623-1 to 623-N, little insertion loss results. The MMPA-type signal transmitting system under multiple FAs only has to maintain almost the same transmit power as with the use of a single FA. Therefore, the MMPAs 623-1 to 623-N are optimized according to the broad-band characteristics of the multiple FAs. Unlike the use of multiple FAs with the CCB, successive multi-FA amplifications are possible.

The FEB 640 performs RF preprocessing on the signal received from the PCB 625 and sends the preprocessed signal through the ANT 650.

The PDB 621 and the PCB 625 may be replaced with a Switchable Power Divider (SPD) and a Switchable Power Combiner (SPC), respectively, which will be described with reference to FIG. 7.

Figure 7:
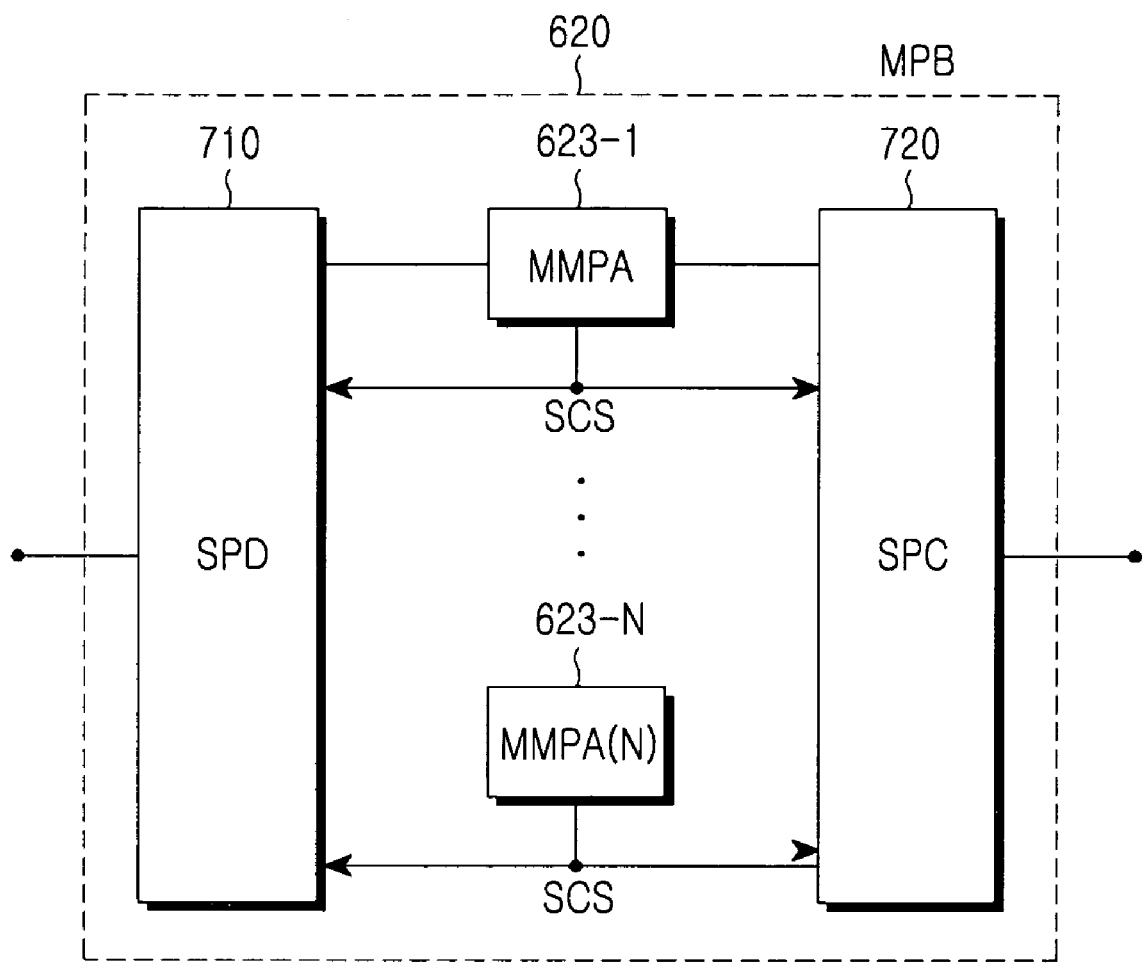
FIG. 7 is a block diagram of a Multi-FA Power amplifier Block (MPB) configured to have a Switchable Power Divider (SPD) and a Switchable Power Combiner (SPC), as illustrated in FIG. 6.

FIG. 7 is a block diagram of the MPB 620 configured to include an SPD and an SPC, as illustrated in FIG. 6.

As described with reference to FIG. 6, the PDB functions to equally distribute signal power, while maintaining the same frequency of an input signal and the PCB combines N signals with the same amplitude, phase and frequency. An SPD 710 and an SPC 720 add switching functionality to the paths between the PDB and the PCB.

The SPD 710 and the SPC 720 switch on/off their input and output terminals according to Switch Control Signals (SCSs) generated from the MMPAs 623-1 to 623-N, so as to prevent insertion loss in the SPD 710 and the SPC 720 in case of some defect in a particular path. For example, the MPB 620 does not have the MMPA 623-N, or if it has the MMPA 623-N, when the MMPA 623-N to which a defect has occurred is connected to the SPD 710 and the SPC 720, a mismatch-incurred insertion loss is created. To prevent the mismatch-incurred insertion loss, the SPD 710 and the SPC 720 switch off the path to the MMPA 623-N according to an SCS.

As described above, the present invention provides a signal transmitting system using an MMPA in a communication system, which achieves the same advantages as with the use of an SCPA in terms of overall system efficiency and manufacturing cost in the case of using a small number of FAs (e.g. a single FA strategy), and which achieves the same advantages as with the use of an MCPA in terms of PA capacity and cooling capacity in the case of using a large number of FAs (e.g. a multi-FA strategy). Therefore, the signal transmitting system is optimized in terms of efficiency and cost competitiveness according to the number of used FAs, thereby maximizing system competitiveness.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A signal transmitting system in a communication system, comprising:
   a multi-frequency assignment (FA) input signal generation block (MGB) for generating a multi-FA signal by combining single FA signals to be transmitted by N FAs under a predetermined control;
   a multi-FA power amplifier block (MPB) for dividing the power of the multi-FA signal by N under the predetermined control, amplifying the N divided signals according to adjusted amplification characteristics under the predetermined control, and combining the power of the amplified N signals; and
   a multi-mode power amplifier (MMPA) mode controller (MMC) for controlling adjustment of the amplification characteristics according to an FA strategy being used; wherein N is a natural number greater than 2.

2. The signal transmitting system of claim 1, further comprising a front-end block (FEB) for radio frequency (RF)-preprocessing the power-combined signal received from the MPB and transmitting the preprocessed signal using an antenna.

3. The signal transmitting system of claim 1, wherein the MGB comprises:
   N single-FA input signal generation blocks (SGBs) for generating a single FA signal using each information signal according to a predetermined FA; and
   an FA combiner block (FCB) for generating the multi-FA signal by FA-combining the single FA signals received from the N SGBs under the control of the MMC.

4. The signal transmitting system of claim 3, wherein the MPB comprises:
   a power divider block (PDB) for dividing the power of the multi-FA signal by N;
   N MMPAs for amplifying the N power-divided signals according to the adjusted amplification characteristics under the predetermined control; and
   a power combiner block (PCB) for combining the power of the N amplified signals.

5. The signal transmitting system of claim 4, wherein the MMC determines an operation mode for the N MMPAs according to the FA strategy and controls adjustment of the amplification characteristics of the MMPAs according to the determined operation mode.

6. The signal transmitting system of claim 5, wherein the operation mode is one of a single FA mode in which the signal transmitting system uses a single FA and a multi-FA mode in which the signal transmitting system uses multiple FAs.

7. The signal transmitting system of claim 1, wherein the MMC determines the operation mode of N MMPAs included in the MPB according to the FA strategy, controls adjustment of the amplification characteristics of the MMPAs, and determines whether to use a linearizer and which type of linearizer to use, based on the determined operation mode.

8. The signal transmitting system of claim 7, wherein the operation mode comprises one of:
   a single FA mode in which the signal transmitting system uses a single FA; and
   a multi-FA mode in which the signal transmitting system uses multiple FAs.

9. A signal transmitting method in a communication system, comprising the steps of:
   generating a multi-frequency assignment (FA) signal by combining single FA signals to be transmitted by N FAs;
   determining an operation mode of N multi-mode power amplifiers (MMPAs) according to an FA strategy being used and controlling adjustment of amplification characteristics of the N MMPAs according to the operation mode; and
   dividing the power of the multi-FA signal by N, amplifying the N divided signals according to the adjusted amplification characteristics, and combining the power of the amplified N signals; wherein N is a natural number greater than 2.

10. The signal transmitting method of claim 9, further comprising radio frequency (RF)-preprocessing the power-combined signal and transmitting the preprocessed signal.

11. The signal transmitting method of claim 9, wherein the multi-FA signal generating step comprises:
    generating single FA signals using respective information signals according to predetermined FAs; and
    generating the multi-FA signal by FA-combining the single FA signals.

12. The signal transmitting method of claim 9, wherein the operation mode is one of a single FA mode in which the signal transmitting system uses a single FA and a multi-FA mode in which the signal transmitting system uses multiple FAs.

13. The signal transmitting method of claim 12, wherein the adjustment of amplification characteristics comprises determining whether to use a linearizer and which type of linearizer to use, based on the determined operation mode.

* * * * *